United States Patent
Yoshida et al.

[11] Patent Number: 5,580,704
[45] Date of Patent: Dec. 3, 1996

[54] DYE SOLUTION FOR PHOTOSENSITIVE LITHOGRAPHIC PRINTING PLATE REQUIRING NO FOUNTAIN SOLUTION

[75] Inventors: Susumu Yoshida; Tsuneo Kusaka; Yoshihiko Urabe, all of Shizuoka, Japan

[73] Assignee: Fuji Photo Film Co., Ltd., Ashigara, Japan

[21] Appl. No.: 502,849

[22] Filed: Jul. 14, 1995

[30] Foreign Application Priority Data

Jul. 15, 1994 [JP] Japan .................. 6-164282

[51] Int. Cl.$^6$ ...................................... G03C 5/00
[52] U.S. Cl. .................. 430/331; 430/272; 430/302; 430/304; 430/310; 430/323; 430/326
[58] Field of Search ...................... 430/272, 303, 430/304, 310, 323, 326, 331

[56] References Cited

U.S. PATENT DOCUMENTS

| | | | |
|---|---|---|---|
| 4,391,897 | 7/1983 | Gracia et al. | 430/331 |
| 4,959,296 | 9/1990 | Yoshida et al. | 430/331 |
| 5,126,228 | 6/1992 | Higashi et al. | 430/272 |
| 5,230,989 | 7/1993 | Urabe et al. | 430/303 |
| 5,290,665 | 3/1994 | Kii et al. | 430/331 |

FOREIGN PATENT DOCUMENTS 3129350  6/1991  Japan .

*Primary Examiner*—Hoa Van Le
*Attorney, Agent, or Firm*—Burns, Doane, Swecker & Mathis, L.L.P.

[57] ABSTRACT

The present invention provides a dye solution for a photosensitive lithographic printing plate requiring no fountain solution comprising a photosensitive layer and a silicone rubber layer provided in this order on a support, which comprises at least one basic dye, at least one organic solvent having a water solubility of less than 10% at 20° C., at least one hydrotrope agent, and at least one anionic surface active agent represented by the following general formula (I):

$$R^1O\text{—}(CH_2CH_2O)_n\text{—}SO_3M^1 \qquad (I)$$

wherein
- $R^1$ represents an alkyl, aryl, aralkyl, alkenyl or alkynyl group;
- $M^1$ represents an alkaline metal, $NH_4$, $NH(C_2H_4OH)_3$, $NH_2(C_2H_4OH)_2$ or $NH_3(C_2H_4OH)$; and
- n represents an integer 1 to 100.

19 Claims, 1 Drawing Sheet

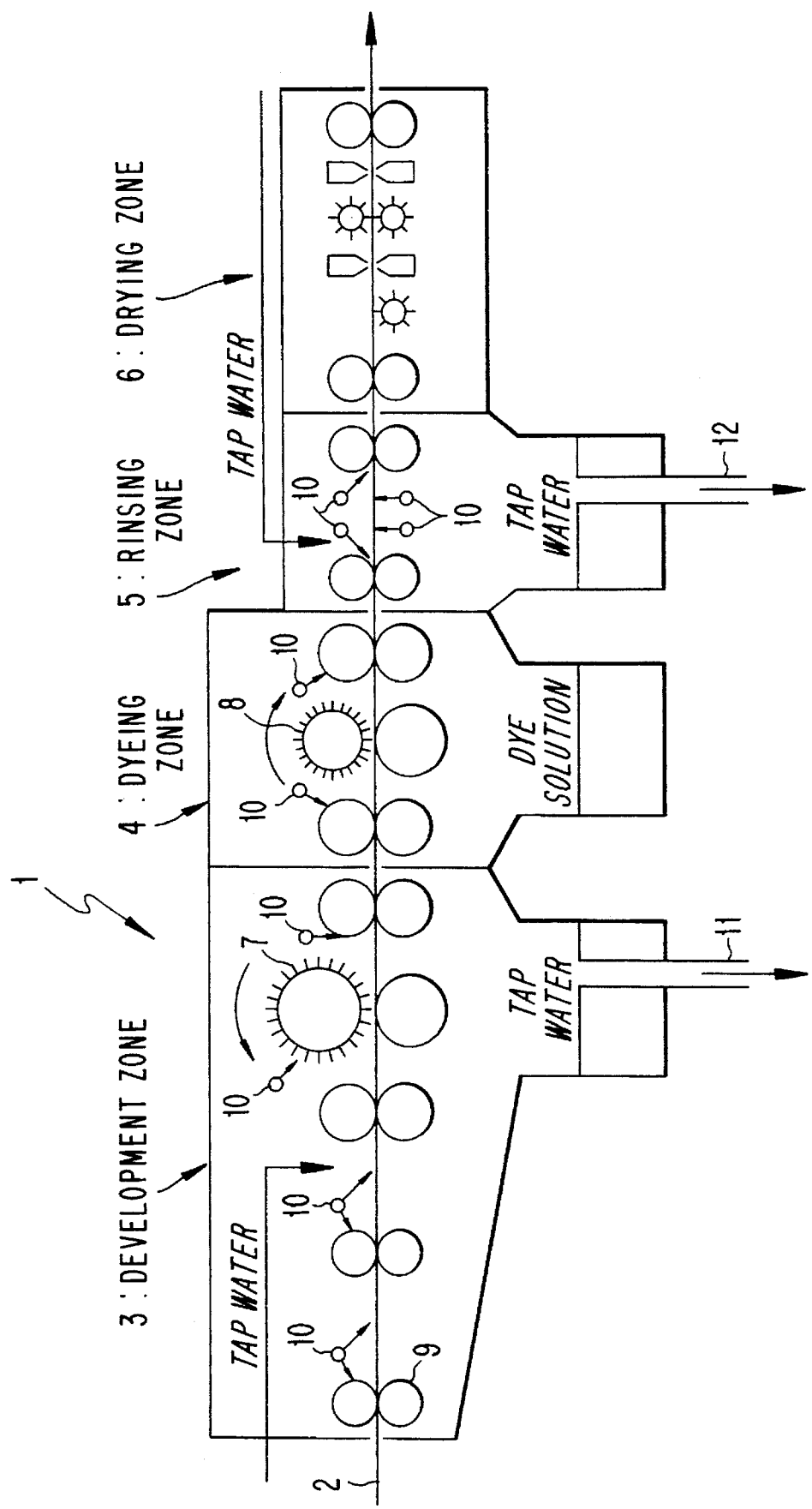

DYE SOLUTION FOR PHOTOSENSITIVE LITHOGRAPHIC PRINTING PLATE REQUIRING NO FOUNTAIN SOLUTION

FIELD OF THE INVENTION

The present invention relates to a dye solution for a photosensitive lithographic printing plate requiring no fountain solution comprising a photosensitive layer and a silicone rubber layer provided in this order on a support. More particularly, the present invention relates to a dye solution for a waterless photosensitive lithographic printing plate which exhibits a high dye density and a less foamability, causes no stain on the printing plate and enhances the scratch resistance of the silicone rubber layer.

BACKGROUND OF THE INVENTION

Various photosensitive lithographic printing plates requiring no fountain solution (hereinafter referred to as "waterless lithographic printing plate") for lithographic printing without fountain solution have been proposed. Among them, those comprising a photosensitive layer and a silicone rubber layer coated on a support in this order as disclosed in JP-B-54-26923 (The term "JP-B" as used herein means an "examined Japanese patent publication"), JP-B-55-22781, JP-B-56-23150, and JP-A-2-236550 (The term "JP-A" as used herein means an "unexamined published Japanese patent application") have extremely high performances.

As a process for the development of such a waterless lithographic printing plate, there is a process which comprises developing the plate by the use of a hydrocarbonic organic solvent which swells only a silicone rubber layer or a hydrocarbonic organic solvent with a polar solvent added thereto, and then dyeing it, as disclosed in JP-B-56-23150, JP-A-57-13448, JP-A-59-146054, and JP-A-63-52145. However, this process requires a long development time. In order to obtain fine halftone dots on the highlight with a good reproducibility, it is necessary that the printing plate be brushed to a certain extent. Accordingly, this process is disadvantageous in that even the silicone rubber layer to be left as non-image area can be damaged. On the other hand, JP-B-63-46407 discloses a process which comprises eluting a part or whole of the photosensitive layer on the image area with a processing solution capable of dissolving at least a part of the photosensitive layer on the image area, and then rubbing the printing plate in the presence of water or a solvent mainly composed of water which doesn't swell the silicone rubber layer to peel off the silicone rubber layer. Further, JP-A-1-159644 and JP-A-3-231752 disclose a developer comprising water as a main component. These approaches can provide drastic reduction of damage of the silicone rubber layer on the non-image area during development but leave much to be desired in the prevention of damage on the silicone rubber layer in handling and printing after processing.

In order to solve the foregoing problems, an approach has been proposed which comprises, after the development with an aqueous developer for removing substantially only the silicone rubber layer on the unexposed area, the dyeing with a dye solution containing a difficultly water-soluble compound, so that the non-image area can be plasticized by the difficultly water-soluble compound, enhancing the scratch resistance of the waterless lithographic printing plate thus processed.

However, this approach is disadvantageous in that when the printing plate thus dyed is rinsed, precipitation occurs. Further, the silicone rubber layer on the nonimage area or the back side of the support is stained. When the dye tank is drained and rinsed, precipitates are produced and attached to the tank, roller and filter, interrupting the rinsing.

JP-A-3-129350 discloses a dye solution comprising a nonionic surface active agent. However, such a dye solution comprising a nonionic surface active agent is disadvantageous in that when the processing is effected with such a dye solution in an automatic developing/dyeing machine equipped with a brush roller in the development and dyeing zones, remarkable foaming occurs.

SUMMARY OF THE INVENTION

It is therefore an object of the present invention to provide a dye solution which exhibits a high dye density and a less foamability, enhances the scratch resistance of a waterless lithographic printing plate and produces no precipitates due to rinsing after dyeing, causing no stain on the silicone rubber layer on the nonimage area, the back side of the support and the rubber roller, tank, filter, etc. in the automatic developing machine.

The foregoing object of the present invention will become more apparent from the following detailed description and examples.

The foregoing difficulties of the present invention can be eliminated by the use of a dye solution for waterless photosensitive lithographic printing plate comprising at least one basic dye, at least one organic solvent having a water solubility of less than 10% at 20° C., at least one hydrotrope agent, and at least one anionic surface active agent represented by the following general formula (I):

$$R^1O-(CH_2CH_2O)_n-SO_3M^1 \tag{I}$$

wherein
  $R^1$ represents an alkyl, aryl, aralkyl, alkenyl or alkynyl group;
  $M^1$ represents an alkaline metal (e.g., Na, K), $NH_4$, $NH(C_2H_4OH)_3$, $NH_2(C_2H_4OH)_2$ or $NH_3(C_2H_4OH)$; and
  n represents an integer 1 to 100, following the development with an aqueous developer for removing substantially only the silicone rubber layer from the unexposed area after the imagewise exposure of a waterless lithographic printing plate comprising a photosensitive layer and a silicone rubber layer laminated in this order on a support.

BRIEF DESCRIPTION OF THE DRAWING

By way of example and to make the description more clear, reference is made to the accompanying drawing in which:

the FIGURE is a schematic diagram illustrating an apparatus for processing a waterless lithographic printing plate wherein the reference numeral 1 indicates a waterless lithographic printing plate, the reference numeral 2 indicates a waterless lithographic printing plate, the reference numeral 3 indicates a development zone, the reference numeral 4 indicates a dyeing zone, the reference numeral 5 indicates a rinsing zone, the reference numeral 6 indicates a drying zone, the reference numerals 7 and 8 each indicate a brush roller, the reference numeral 9 indicates a roller, the reference numeral 10 indicates a spray, and the reference numerals 11 and 12 each indicate an overflow exit.

DETAILED DESCRIPTION OF THE INVENTION

In the present invention, the lithographic printing plate which has been developed with an aqueous developer for removing substantially only the silicone rubber layer from the unexposed area is dyed with a dye solution comprising (a) at least one basic dye, (b) at least one organic solvent having a water solubility of less than 10% at 20° C., (c) at least one hydrotrope agent, and (d) at least one anionic surface active agent represented by the general formula (I).

The use of the dye solution of the present invention enables the foregoing organic solvent to efficiently plasticize the nonimage area, enhancing the scratch resistance of the lithographic printing plate after processing and the press life during printing. Further, the dye solution of the present invention exhibits a high dye density and a less foamability. Moreover, the addition of the anionic surface active agent represented by the general formula (I) makes it possible to inhibit precipitation during rinsing, preventing the silicone rubber layer on the nonimage area and the back side of the support from being stained. The reason for this mechanism is not thoroughly made obvious. It can be presumed that the sulfate group in the anionic surface active agent and the basic dye form a complex which is then solubilized in water by the hydrophilicity of the polyethylene oxide group in the anionic surface active agent.

The present invention will be further described hereinafter.

The waterless lithographic printing plate according to the present invention must have a flexibility high enough to be set in an ordinary printing machine as well as withstand the load during printing. Accordingly, typical examples of the support (substrate) include coated paper, metal plate such as aluminum plate, plastic film such as polyethylene terephthalate, rubber, and composite thereof.

In the present invention, a primer layer may be provided between the support and the photosensitive layer. As the primer layer to be used in the present invention there may be used various materials for the purpose of enhancing the adhesive property between the substrate and the photosensitive layer, inhibiting halation and improving the dyeability and printing properties of image. Examples of these materials include various photosensitive polymers which have been exposed and hardened before the lamination of a photosensitive resin layer as disclosed in JP-A-60-229031, thermoset epoxy resins as disclosed in JP-A-62-50760, hardened gelatin as disclosed in JP-A-63-133151, those comprising an urethane resin and a silane coupling agent as disclosed in JP-A-3-200965, and those comprising an urethane resin as disclosed in JP-A-3-273248. Besides these materials, hardened gelatin or casein is useful. Further, for the purpose of softening the primer layer, the foregoing primer layer may comprise a polymer having a glass transition temperature of not higher than room temperature such as polyurethane, polyamide, styrene/butadiene rubber, carboxy-modified styrene/butadiene rubber, acrylonitrile/butadiene rubber, carboxy-modified acrylonitrile/butadiene rubber, polyisoprene, acrylate rubber, polyethylene, chlorinated polyethylene and chlorinated polypropylene incorporated therein. The mixing ratio of such a polymer is arbitrary. The foregoing additive may be singly used to form a primer layer so far as a film layer can be formed. Moreover, for the foregoing purposes, the primer layer may also comprise additives such as dye, pH indicator, printing agent, photopolymerization initiator, adhesive aid (e.g., polymerizable monomer, diazo resin, silane coupling agent, titanate coupling agent, aluminum coupling agent), pigment and silica powder incorporated therein. Alternatively, a primer layer which has been coated may be exposed to light so that it is hardened. In general, the dry coating weight of the primer layer is preferably in the range of 0.1 to 20 g/m$^2$, more preferably 1 to 10 g/m$^2$.

As the photosensitive layer employable in the present invention there may be used a photopolymerizable photosensitive layer, a photocrosslinkable photosensitive layer or a photosensitive layer comprising a diazo resin, a binder resin, etc.

The foregoing photopolymerizable photosensitive layer comprises (1) a monomer, oligomer or macromonomer having at least one photopolymerizable ethylenically unsaturated group, (2) a film-forming high molecular compound, and (3) a photopolymerization initiator.

Component (1): monomer, oligomer or macromonomer having at least one photopolymerizable ethylenically unsaturated group Examples of the foregoing monomer, oligomer and macromonomer employable in the present invention include:

(A) Acrylic or methacrylic esters of alcohols (e.g., ethanol, propanol, hexanol, 2-ethylhexanol, cyclohexanol, glycerin, hexanediol, trimethylolpropane, pentaerythritol, sorbitol, triethylene glycol, polyethylene glycol, polypropylene glycol, ω-methoxypolyethylene glycol);

(B) Reaction product of amines (e.g., ethylamine, butylamine, benzylamine, ethylenediamine, hexamethylenediamine, diethylenetriamine, xylylenediamine, ethanolamine, aniline) with acrylic glycidyl, methacrylic glycidyl or allyl glycidyl;

(C) Reaction product of carboxylic acids (e.g., acetic acid, propionic acid, benzoic acid, acrylic acid, methacrylic acid, succinic acid, maleic acid, phthalic acid, tartaric acid, citric acid) with acrylic glycidyl, methacrylic glycidyl or allyl glycidyl; and (D) Amide derivatives (e.g., acrylamide, N-methylolacrylamide, t-butylacrylamide, methylene bisacrylamide, diacetone acrylamide)

Other examples of the foregoing monomer, oligomer and macromonomer employable in the present invention include urethane acrylates as disclosed in JP-B-48-41708, JP-B-50-6034, and JP-A-51-37193, polyfunctional acrylates or methacrylates such as polyester acrylates and epoxy acrylates obtained by the reaction of epoxy resin with (meth)acrylic acid as disclosed in JP-A-48-64183, JP-B-43191, and JP-B-52-30490, and N-methylolacrylamide derivatives as disclosed in U.S. Pat. No. 4,540,649. Further examples of the foregoing monomer, oligomer and macromonomer employable in the present invention include those described as photosetting monomers and oligomers in *Journal of the Adhesion*, Vol. 20, No. 7, pp. 300–308, 1984, and macromonomers as disclosed in P. Dreyfuss & R. P. Quirk, *Encycl. Polym. Sci. Eng.*, 7, 551 (1987), *Kagaku Kogyo (Chemical Industry)*, 38, 56 (1987), and *Kobunshi Kako (Polymer Processing)*, 35, 262 (1986). However, the present invention is not limited to these compounds. In the polyfunctional monomers, various unsaturated groups such as acryl, methacryl, allyl and vinyl groups may be present in admixture. These compounds may be used singly or in combination.

Useful examples of monomers employable in the present invention include:

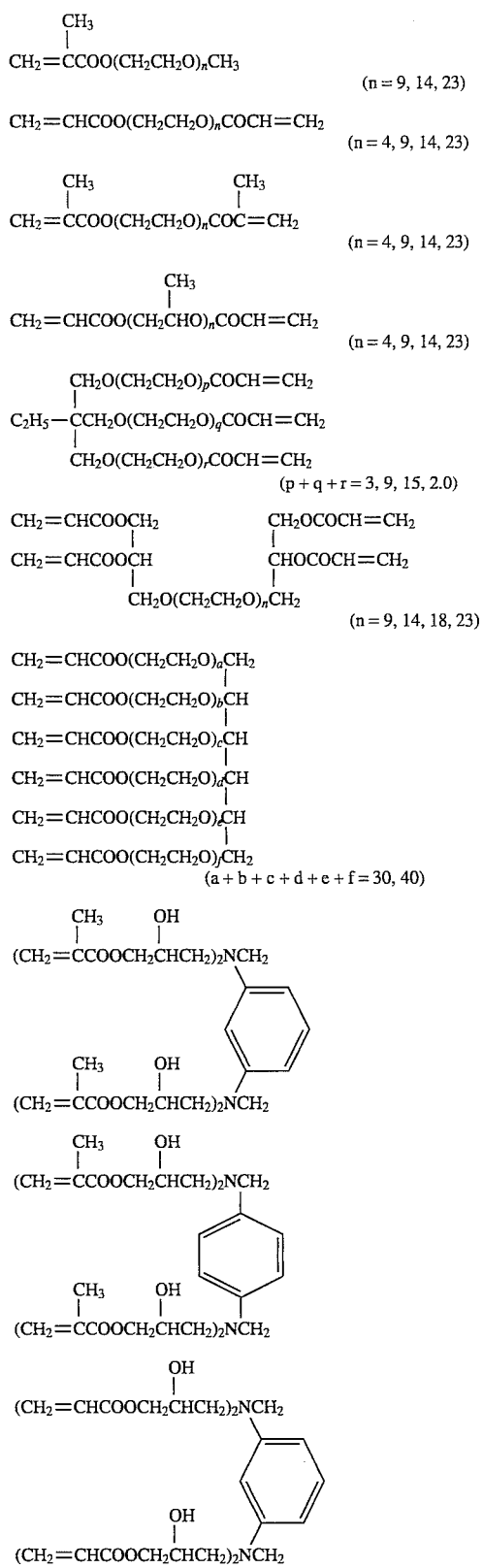

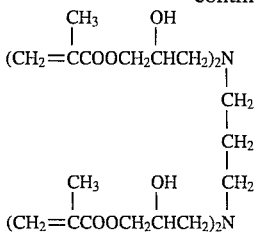

The amount of the monomer to be used is normally from 5 to 70% by weight, preferably from 10 to 60% by weight, more preferably from 20 to 50% by weight based on the total solid content by weight of the photosensitive layer.

Component (2): Film-forming high molecular compound

As the film-forming high molecular compounds employable in the present invention there may be used the following polymers or copolymers:

(1) Vinyl polymer, e.g., polyvinyl acetate, polyvinyl alcohol, polyvinyl butyral, polyvinyl methyl ether, polyvinyl chloride, polyethylene, copolymer thereof;

(2) (Meth)acrylic ester polymer and alkyl (meth)acrylamide polymer, e.g., poly(meth)acrylic ethyl, poly(meth)acrylic butyl, poly-t-butylacrylamide, polydiacetone acrylamide, copolymer thereof;

(3) Unvulcanized rubber, e.g., natural rubber, polybutadiene, polyisobutylene, polyneoprene, copolymer thereof;

(4) Polyether, e.g., polyethylene oxide, polypropylene oxide;

(5) Polyamide, e.g., copolymer of monomers such as caprolactam and laurolactam, reaction product of polyvalent amine with polyvalent carboxylic acid. (Examples of the polyvalent amine include hexamethylenediamine, 4,4'-bis-aminocyclohexylmethane, 2,4,4-trimethylhexamethylenediamine, and isophoronediamine. Examples of the polyvalent carboxylic acid include isophthalic acid, adipic acid, and sebacic acid);

(6) Polyester, e.g., condensate of terephthalic acid, adipic acid, etc. with ethylene glycol, 1,4-butanediol, etc.; and (7) Polyurethane, e.g., polyurethane of hexamethylene diisocyanate, toluene diisocyanate, naphthalene-1,5-diisocyanate, isophorone diisocyanate, etc. with ethylene glycol, 1,4-butanediol, polyester, etc.

As a chain extender there may be used isophoronediamine, hexamethylenediamine or the like.

Further, as the film-forming high molecular compound there can be used a high molecular compound having a photopolymerizable or photocrosslinkable olefinically unsaturated double bonding group in its side chain. However, the present invention is not limited to these compounds.

These compounds may be used singly or in combination. The amount of such a film-forming high molecular compound to be added is in the range of 20 to 90% by weight, preferably 30 to 80% by weight, more preferably 35 to 75% by weight, based on the total solid content by weight of the photosensitive layer composition.

Component (3): Photopolymerization initiator

Typical examples of the photopolymerization initiator employable in the present invention include:

a) Benzophenone derivatives, e.g., benzophenone, Michler's ketone, xanthone, anthrone, thioxanthone, acridone, 2-chloroacridone, 2-chloro-N-n-butylacridone, 2,4-diethylthioxanthone, fluorenone;

b) Benzoin derivatives, e.g., benzoin, benzoin methyl ether, benzoin ethyl ether;

c) Quinones, e.g., p-benzoquinone, β-naphthoquinone, β-methylanthraquinone;

d) Sulfur compounds, e.g., dibenzyl disulfide, di-n-butyl disulfide;

e) Azo or diazo compounds, e.g., 2-azobisisobutyronitrile, 1-azobis-1-cyclohexanecarbonitrile, p-diazobenzylethylaniline, congo red;

f) Halogen compounds, e.g., carbon tetrachloride, silver bromide, α-chloromethylnaphthaline, trihalomethyl-s-triazine compound; and g) Peroxides, e.g., benzoyl peroxide.

These photopolymerization initiators may be used singly or in combination. The amount of such a photopolymerization initiator to be added is in the range of 0.1 to 25% by weight, preferably 3 to 20% by weight based on the total solid content by weight of the photosensitive layer composition.

Other components:

Besides these components, a thermal polymerization inhibitor is preferably incorporated in the system. For example, hydroquinone, p-methoxyphenol, di-t-butyl-p-cresol, pyrogallol, t-butyl catechol, 4,4'-thiobis(3-methyl-6-t-butylphenol), 2,2'-methylenebis(4-methyl-6-t-butylphenol), and 2-mercaptobenzoimidazole are employable. If necessary, a dye or pigment may be incorporated in the system for the purpose of coloring the photosensitive layer. Further, a pH indicator or leuco dye may be incorporated in the system as a printing agent. Depending on the purpose, the photosensitive layer may further comprise a small amount of a silicone compound such as polydimethyl siloxane, methylstyrene-modified polydimethyl siloxane, olefin-modified polydimethyl siloxane, polyether-modified polydimethyl siloxane, silane coupling agent, silicon diacrylate and silicon dimethacrylate incorporated therein. In order to improve the coatability of the coating solution, the coating solution may comprise a siliconic surface active agent or fluorinic surface active agent incorporated therein. In order to improve the adhesive property between the photosensitive layer and the primer layer, the coating solution may further comprise a diazo resin incorporated therein. Further, the coating solution may comprise a plasticizer for rendering the coat flexible (e.g., polyethylene glycol, tricresyl phosphate) or a stabilizer (e.g., phosphoric acid) incorporated therein. The amount of these additives to be added is normally in the range of 0 to 10% by weight based on the total solid content by weight of the photosensitive layer composition. If necessary, a hydrophobic silica powder treated with a (meth)acryloyl- or allyl-containing silane coupling agent may be incorporated in the coating solution in an amount of 0 to 50% by weight based on the total solid content by weight of the photosensitive layer composition.

As the diazo resin which constitutes the photosensitive layer comprising a diazo resin and a binder resin there may be preferably used a condensate of an aromatic diazonium salt and formaldehyde. Particularly preferred examples of such a compound include a salt of p-diazodiphenylamine with formaldehyde or acetaldehyde, e.g., inorganic salt of diazo resin which is a reaction product of hexafluorophosphate, tetrafluoroborate, perchlorate or periodate with the foregoing condensate, and organic salt of diazo resin which is a reaction product of the foregoing condensate with a sulfonic acid as disclosed in U.S. Pat. No. 3,200,309. The content of such a diazo resin in the photosensitive layer is preferably in the range of 20 to 95% by weight, more preferably 35 to 80% by weight.

As the binder resin there may be any kind of high molecular compound. Preferred examples of such a high molecular compound include copolymer of a monomer having an aromatic hydroxyl group such as N-(4-hydroxyphenyl)acrylamide, N-(4-hydroxyphenyl)methacrylamide, o-, m- or p-hydroxystyrene and o-, m- or p-hydroxyphenyl methacrylate with other monomers as disclosed in JP-A-54-98613, polymer containing a hydroxyethyl (meth)acrylate unit as a repeating unit as disclosed in U.S. Pat. No. 4,123,276, copolymer resin comprising a monomer unit having a phenolic hydroxyl group and a monomer unit having an alcoholic hydroxyl group as disclosed in JP-A-3-158853, natural resin such as shellac and rosin, polyvinyl alcohol, polyamide resin as disclosed in U.S. Pat. No. 3,751,257, linear polyurethane resin as disclosed in U.S. Pat. No. 3,660,097, resin obtained by phthalating a polyvinyl alcohol, epoxy resin obtained by the condensation of bisphenol A and epichlorohydrin, and cellulose such as cellulose butyrate and cellulose acetate.

Further, a compound comprising as a main component a photosensitive polymer such as polyester, polyamide and polycarbonate containing —CH=CH—CO— as a photosensitive group in its main or side chains may be used. Examples of such a compound include photosensitive polyester made of a condensate of phenylenediethyl acrylate with hydrogenated bisphenol A and triethylene glycol as disclosed in JP-A-55-40415, and photosensitive polyester derived from a (2-propenylidene)malonic compound such as cinnamylidenemalonic acid and a bifunctional glycol as disclosed in U.S. Pat. No. 2,956,878.

The photosensitive layer comprising the foregoing diazo resin, too, may comprise a dye, a surface active agent, a plasticizer, a stabilizer, etc. incorporated therein.

The foregoing photosensitive layer composition according to the present invention is coated onto the substrate in the form of solution in a proper solvent such as 2-methoxyethanol, 2-methoxyethyl acetate, propylene glycol methyl ethyl acetate, methyl lactate, ethyl lactate, propylene glycol monomethyl ether, ethanol, methyl ethyl ketone and N,N-dimethylacetamide, singly or in admixture. The dry coating weight of the photosensitive layer composition is preferably in the range of 0.1 to 20 $g/m^2$, more preferably 0.5 to 15 $g/m^2$.

The crosslinked silicone rubber layer to be used in the present invention is a film formed by hardening the following composition A or B:

| Composition A: | (parts by weight) |
| --- | --- |
| (a) Diorganopolysiloxane (number-average molecular weight: 3,000 to 40,000) | 100 |
| (b) Condensed crosslinking agent | 3 to 70 |
| (c) Catalyst | 0.01 to 40 |

The diorganosiloxane as the foregoing component (a) is a polymer having a repeating unit represented by the following general formula (A) in which R and R' each represent a $C_{1-10}$ alkyl, vinyl or aryl group which may contain other suitable substituents. In general, 60% or more of R and R' are preferably methyl group or halogenated vinyl or phenyl group.

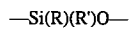  (A)

Such a diorganopolysiloxane is preferably terminated by hydroxyl group at both ends thereof.

The foregoing component (a) has a number-average molecular weight of 3,000 to 40,000, preferably 5,000 to 36,000.

The condensed crosslinking agent as the component (b) may be of any kind so far as it is condensed. It is preferably represented by the following general formula (B):

$$Rm \cdot Si \cdot Xn \qquad (B)$$

(m+n=4, with the proviso that n is not less than 2) wherein

R is as defined above; and

X represents a halogen atom such as chlorine, bromine and iodine, a hydrogen atom, a hydroxyl group or an organic substituent such as —O—$COR^2$, —$OR^2$, —O—N=$CR^3R^4$ and —$NR^3R^4$ (in which $R^2$ represents a $C_{1-10}$ alkyl group or a $C_{6-20}$ aryl group, and $R^3$ and $R^4$ each represent a $C_{1-10}$ alkyl group).

Examples of the catalyst as the component (c) include carboxylates of metal such as tin, zinc, lead, calcium and manganese (e.g., dibutyltin laurate, lead octylate and lead naphthenate), and known catalysts such as chloroplatinic acid.

| Composition B: | (parts by weight) |
|---|---|
| (d) Diorganopolysiloxane having addition-reactive functional group (number-average molecular weight: 3,000 to 40,000) | 100 |
| (e) Organohydrogen polysiloxane | 0.1 to 10 |
| (f) Addition catalyst | 0.00001 to 1 |

The diorganopolysiloxane having an addition-reactive functional group as the component (d) is an organopolysiloxane having at least two alkenyl groups (preferably vinyl groups) directly bonded to a silicon atom per molecule (number-average molecular weight: 3,000 to 40,000). The alkenyl group may be positioned either at the ends of the molecule or at the middle point in the molecule. Examples of organic groups other than alkenyl group include substituted or unsubstituted $C_{1-10}$ alkyl group and aryl group. The component (d) may optionally contain a slight amount of a hydroxyl group.

The component (d) has a number-average molecular weight of 3,000 to 40,000, preferably 5,000 to 36,000.

Examples of the component (e) include hydrogen both-terminated polydimethylsiloxane, α, ω-dimethylpolysiloxane, methyl both-terminated methylsiloxane-dimethylsiloxane copolymer, cyclic polymethylsiloxane, trimethylsilyl both-terminated polymethylsiloxane, and trimethylsilyl both-terminated dimethylsiloxane-methylsiloxane copolymer.

As the component (f) there may be arbitrarily selected from known compounds. In particular, platinum compounds are preferred. Examples of such platinum compounds include platinum, platinum chloride, chloroplatinic acid, and olefin-coordinated platinum.

For the purpose of controlling the hardening rate of these compositions, a crosslinking inhibitor such as vinyl-containing organopolysiloxane (e.g., tetracyclo(methylvinyl)siloxane), carbon-carbon triple bond-containing alcohol, acetone, methyl ethyl ketone, methanol, ethanol and propylene glycol monomethyl ether may be incorporated therein.

The silicone rubber layer may comprise an adhesion aid or photopolymerization initiator such as finely divided powder of an inorganic substance (e.g., silica, calcium carbonate, titanium oxide), silane coupling agent, titanate coupling agent and aluminum coupling agent.

If the silicone rubber layer of the present invention has too small a thickness, it renders the printing plate less ink repellent and more liable to scratch. On the contrary, if the silicone rubber layer has too large a thickness, it deteriorates the developability of the printing plate. Therefore, the thickness of the silicone rubber layer is preferably in the range of 0.5 to 5 g/m², more preferably 1 to 3 g/m².

In the waterless lithographic printing plate as defined herein, the silicone rubber layer may be further coated with various silicone rubber layers. For the purpose of enhancing the adhesive property between the photopolymerizable photosensitive layer and the silicone rubber layer or inhibiting the contamination of the catalyst in the silicone rubber layer, an adhesive layer may be provided between the photopolymerizable photosensitive layer and the silicone rubber layer.

In order to protect the surface of the silicone rubber layer, the silicone rubber layer may be laminated with a transparent film such as polyethylene, polypropylene, polyvinyl chloride, polyvinylidene chloride, polyvinyl alcohol, polyethylene terephthalate and cellophane or coated with a polymer. These films may be oriented before use. Further, these films may be matte-finished to improve the vacuum adhesion in the printing frame during imagewise exposure.

The waterless lithographic printing plate according to the present invention is exposed to light through a transparent original, and then developed with a developer capable of dissolving or swelling a part of the photosensitive layer on the image area (unexposed area).

As the developer employable in the present invention there may be used water or an aqueous solution of an organic solvent. Taking into account the safety and inflammability, the concentration of the water-soluble solvent is preferably less than 40% by weight.

Specific examples of the developer employable in the present invention include the following compounds:

Alcohols: e.g., methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol;

Ketones: e.g., acetone, methyl ethyl ketone;

Esters: e.g., ethyl acetate, methyl lactate, butyl lactate, propylene glycol monomethyl ether acetate, diethylene glycol acetate, diethyl phthalate;

Others: e.g., triethyl phosphate, tricresyl phosphate; Mixture of the foregoing organic solvent with water; the foregoing organic solvent which has been solubilized in water with a surface active agent or the like;

Water: e.g., tap water, pure water, distilled water

The development may be carried out by a known method, e.g., by rubbing the surface of the lithographic printing plate with a development pad impregnated with a developer as mentioned above or rubbing the surface of the lithographic printing plate with a development brush while the developer being poured thereonto or thereafter. The developer temperature may be arbitrary but is preferably in the range of 10° C. to 50° C. In this manner, only the silicone rubber layer on the unexposed area is removed, rendering the area ink-receptive.

The printing plate thus obtained may be dyed with a dye solution on the exposed image area so that the image area can be detected to confirm its image forming properties. The image area may be lightly rubbed with a soft pad impregnated with a dye solution to cause only the exposed image area on the photosensitive layer to be dyed, making it possible to confirm that development has been made up to highlight area.

Further, the printing plate may be rinsed and then dried in order to remove the silicon rubber layer on the nonimage area and the dye solution of the back side of the support.

The dye solution of the present invention contains at least one anionic surface active agent represented by the general formula (I):

$$R^1O-(CH_2CH_2O)_n-SO_3M^1 \qquad (I)$$

wherein $R^1$ represents an alkyl, aryl, aralkyl, alkenyl or alkynyl group;

$M^1$ represents an alkaline metal (e.g., Na, K), $NH_4$, $NH(C_2H_4OH)_3$, $NH_2(C_2H_4OH)_2$ or $NH_3(C_2H_4OH)$; and n represents an integer 1 to 100.

Examples of the alkyl group represented by $R^1$ include the following $C_{1-25}$ straight-chain or branched alkyl groups:

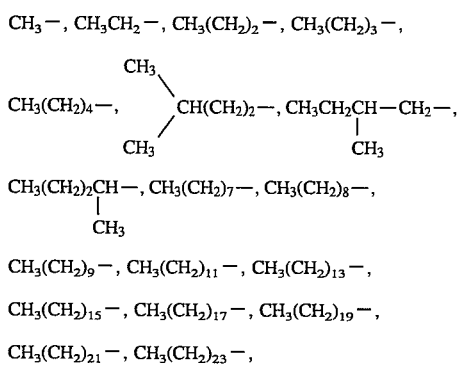

Examples of the aryl group represented by $R^1$ include the following monocyclic or bicyclic aryl groups which may be substituted by straight-chain or branched alkyl groups, phenyl group, naphthyl group,

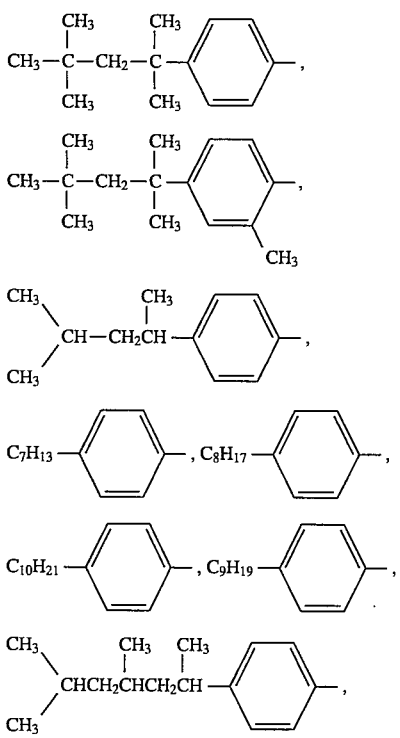

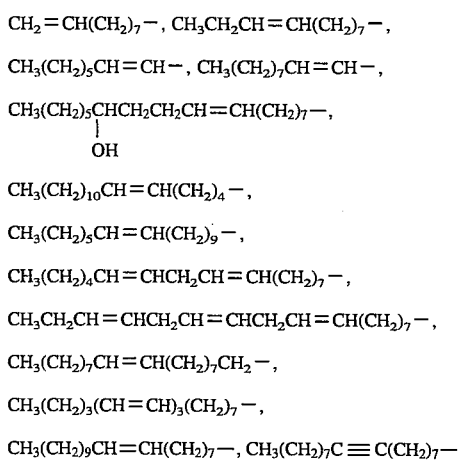

Examples of the alkenyl or alkynyl group represented by $R^1$ include the following $C_{9-24}$ alkenyl or alkynyl groups:

$CH_2=CH(CH_2)_7-$, $CH_3CH_2CH=CH(CH_2)_7-$, $CH_3(CH_2)_5CH=CH-$, $CH_3(CH_2)_7CH=CH-$, $CH_3(CH_2)_5\underset{\underset{OH}{|}}{C}HCH_2CH_2CH=CH(CH_2)_7-$, $CH_3(CH_2)_{10}CH=CH(CH_2)_4-$, $CH_3(CH_2)_5CH=CH(CH_2)_9-$, $CH_3(CH_2)_4CH=CHCH_2CH=CH(CH_2)_7-$, $CH_3CH_2CH=CHCH_2CH=CHCH_2CH=CH(CH_2)_7-$, $CH_3(CH_2)_7CH=CH(CH_2)_7CH_2-$, $CH_3(CH_2)_3(CH=CH)_3(CH_2)_7-$, $CH_3(CH_2)_9CH=CH(CH_2)_7-$, $CH_3(CH_2)_7C\equiv C(CH_2)_7-$ Examples of the aralkyl group represented by $R^1$ include the following aralkyl groups having aryl groups attached to alkyl groups:

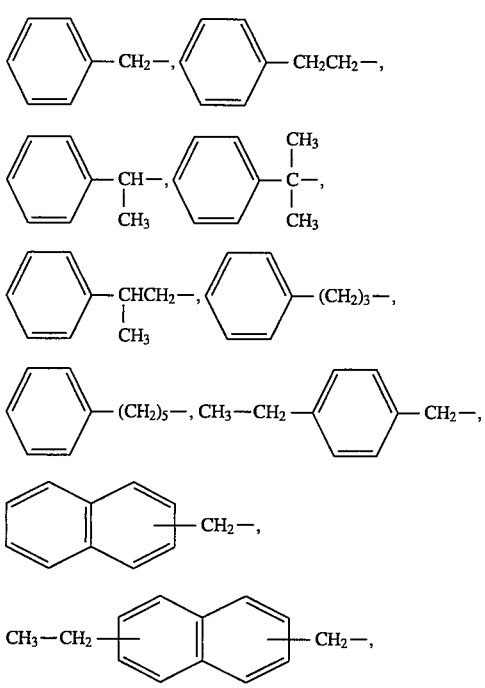

In the foregoing general formula (I), n represents an integer 1 to 100, preferably 1 to 70, particularly 1 to 50.

$M^1$ represents an alkaline metal (e.g., Na, K), $NH_4$, $NH(C_2H_4OH)_3$, $NH_2(C_2H_4OH)_2$ or $NH_3(C_2H_4OH)$, preferably Na, $NH_4$ or $NH(C_2H_4OH)_3$.

Specific preferred examples of the anionic surface active agent represented by the general formula (I) employable in the present invention include sodium poly(oxyethylene) alkyl ether sulfate (e.g., sodium poly(oxyethylene) oleyl ether sulfate, sodium poly(oxyethylene) cetyl ether sulfate, sodium poly(oxyethylene) lauryl ether sulfate, sodium poly(oxyethylene) stearyl ether sulfate), triethanolamine poly(oxyethylene) lauryl ether sulfate, ammonium poly(oxyethylene) lauryl ether sulfate, sodium poly(oxyethylene) alkyl phenol ether sulfate (e.g., sodium poly(oxyethylene) octyl phenol ether sulfate, sodium poly(oxyethylene) nonyl phenol ether sulfate), and sodium poly(oxyethylene) naphthyl ether sulfate. However, the present invention should not be construed as being limited these compounds.

The repeating number of ethylene oxide groups in the anionic surface active agent is preferably from 1 to 100, more preferably from 1 to 70, particularly from 1 to 50.

The content of the anionic surface active agent in the dye solution is preferably from 0.01 to 30% by weight, more preferably from 0.1 to 20% by weight, particularly preferably from 0.5 to 15% by weight.

The dye solution of the present invention contains an organic solvent having a solubility of less than 10% in water at a temperature of 20° C. Specific examples of such an organic solvent include diisobutyl ketone, acetophenone, isophorone, diethyl succinate, methyl benzoate, diethyl oxalate, dimethyl phthalate, isobutyl acetate, benzyl benzoate, ethylene glycol monophenyl ether, ethylene glycol dibutyl ether, ethylene glycol benzyl ether, diethylene glycol monohexyl ether, diethylene glycol dibutyl ether, dimethyl benzyl carbitol, diethylene glycol diacetate, 2-ethylhexyl alcohol, benzyl alcohol, cyclohexanol, 1,3-octanediol, cyclohexanone, N-benzylethanolamine, anisyl alcohol, 2-N-ethylanilinoethanol, N-phenylethanolamine, triacetin, tributin, propylene glycol monophenyl ether, and compound represented by the following formula (II) (e.g., dipropylene glycol monobutyl ether, dipropylene glycol monohexyl ether, tripropylene glycol monobutyl ether, polypropylene glycol monopropyl ether (MW=400)). The present invention is not limited to these compounds.

$$R^6O-(C_3H_6O)_n-R^7 \qquad (II)$$

In the formula $R^6$ represents an alkyl group, an aryl group, an aralkyl group or an alkenyl group; $R^7$ represents a hydrogen atom, an alkyl group, an aryl group, an aralkyl group or an alkenyl group; and n represents an integer of 2 or more. The hydrocarbon groups represented by $R^6$ and $R^7$ each preferably have 1 to 10 carbon atoms, more preferably 1 to 8 carbon atoms.

Preferred among these compounds are the compound represented by the formula (II), ethylene glycol monophenyl ether, diethylene glycol monohexyl ether, benzyl alcohol, 1,3-octanediol, cyclohexanone, N-phenylethanolamine, triacetin, and propylene glycol monophenyl ether.

The concentration of such a compound in the dye solution is preferably in the range of 0.1 to 80% by weight, more preferably 2 to 60% by weight, most preferably 5 to 40% by weight.

The hydrotrope agent to be used in the present invention is a hard acid-soft base type or soft acid-hard base type salt, normally an electrolyte consisting of inorganic ion and organic ion. For hard and soft acid and base, reference can be made to A. Scoot, *Survey of Progress in Chemistry*, pp. 51–52, Academic Press, 1969.

Examples of compounds which can be used as such hydrotrope agents include compounds represented by the following general formulae (III) to (IX):

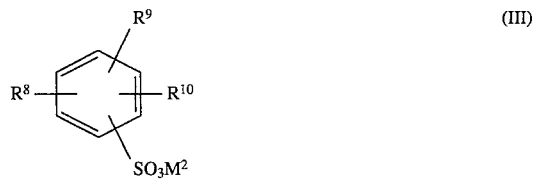

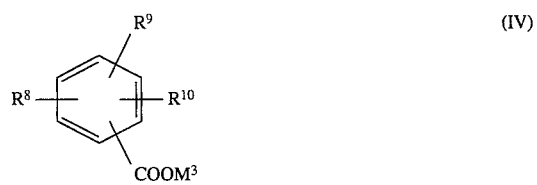

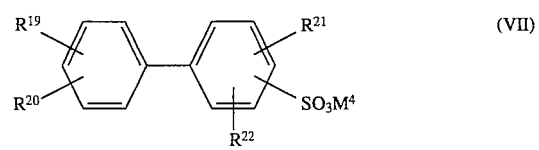

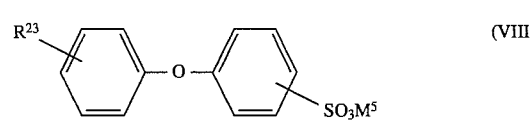

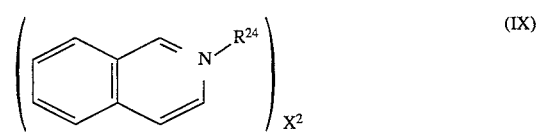

In these general formulae, $R^8$ to $R^{10}$ each independently represent a hydrogen atom, a $C_{1-4}$ alkyl group (including straight-chain and branched alkyl group), a $C_{1-4}$ hydroxylalkyl group, a hydroxyl group, a halogen atom (e.g., chlorine, bromine), a mercapto group, $-SO_3M^6$ or $-COOM^7$.

$R^{11}$ to $R^{18}$ each independently represent a $C_{1-12}$ alkyl group (including straight-chain, branched and cyclic alkyl groups), a $C_{1-4}$ hydroxyalkyl group, a benzyl group or a substituted (e.g., $C_{1-4}$ alkyl (e.g., methyl)-, hydroxyl- or halogen-substituted) or unsubstituted phenyl group.

$R^{19}$ to $R^{23}$ each independently represent a hydrogen atom, a $C_{1-6}$ alkyl group (including straight-chain and branched alkyl group), a hydroxyl group, $-SO_3M^8$ or a $C_{1-6}$ hydroxylalkyl group.

$R^{24}$ represents a hydrogen atom, a $C_{1-12}$ alkyl group (including straight-chain and branched alkyl group) or a $C_{1-12}$ hydroxyalkyl group.

$M^2$ to $M^8$ each represent a hydrogen atom, an alkaline metal (e.g., Na, K) or $NH_4$.

Z represents N, P or B.

$X^1$ represents a counter ion. When Z is N or P, $X^1$ represents an anion (e.g., halogen ion such as chlorine ion, bromine ion and iodine ion, nitric ion, sulfuric ion, phosphoric ion, hydroxyl ion, $PF_6^-$, $BF_4^-$). When Z is B, $X^1$ represents a cation (e.g., alkaline metal ion such as $Li^+$, $Na^+$ and $K^+$, $NH_4^+$). $X^2$ represents an anion (including the foregoing examples).

The suffix n represents an integer of from 1 to 5.

Specific examples of the compounds represented by the formulae (III) to (IX) to be used in the present invention include benzenesulfonic acid, p-toluenesulfonic acid, xylenesulfonic acid, cumensulfonic acid, benzoic acid, salicylic acid, isophthalylsulfonic acid, gallic acid, phenolsulfonic acid, thiosalicylic acid, tetraphenylphosphonium iodide, tetraphenylphosphonium bromide, tetraphenylphosphonium chloride, tetraphenylphosphonium sulfate, tetraphenylphosphonium nitrate, sodium tetraphenylborate, tetra-n-butylphosphonium iodide, tetra-n-butylphosphonium bromide, tetra-n-butylphosphonium chloride, tetra-n-butylphosphonium sulfate, tetra-n-butylphosphonium nitrate, tetrabutylammonium sulfate, tetrabutylammonium nitrate, ethyltriphenylphosphonium bromide, benzyltriphenylphosphonium chloride, tetrabutylphosphonium hydroxide, tetrabutylphosphonium phosphate, ethyltriphenylphosphonium bromide, butyltriphenylphosphonium bromide, diphenylphosphonium chloride, benzyltriphenylphosphonium chloride, tetratollylphosphonium bromide, bis[(benzyl)(diphenyl)phosphorandiyl]ammonium chloride, 1,2-bis(diphenylphosphino)ethanebromide, 4-(butylphenyl)-2-hydroxybenzenesulfonic acid, 4-(butylphenyl)benzenesulfonic acid, and diphenylethersulfonic acid. Further, alkaline metal (e.g., Na, K, Li) salts, ammonium salts, butylisoquinoliniumbromides and methylisoquinoliniumchlorides of these compounds may be used.

Particularly preferred examples of the hydrotrope agent employable in the present invention include sodium p-toluenesulfonate, sodium methaxylenesulfonate, sodium p-ethylbenzenesulfonate, sodium cumensulfonate, sodium naphthalenesulfonate, ammonium xylenesulfonate, and tetrabutylammonium bromide. The present invention is not limited to these compounds. Preferred among these compounds are sodium p-tolenesulfonate, sodium methaxylenesulfonate, p-ethylbenzenesulfonate, and sodium naphthalenesulfonate.

The concentration of hydrotrope agent in the dye solution is preferably in the range of 0.05 to 50% by weight, more preferably 0.5 to 30% by weight, particularly preferably 1 to 25% by weight.

The dye to be contained in the dye solution of the present invention is selected from basic dyes. Particularly preferred among these dyes are triarylmethane basic dyes. Specific examples of these basic dyes include crystal violet, ethyl violet, victoria pure blue, victoria blue, methyl violet, DIABASIC MAGENTA (available from Mitsubishi Kagaku), AIZENE BASIC CYANINE 6GH (available from Hodogaya Chemical Co., Ltd.), PRIMOCYANINE BX CONC. (Sumitomo Chemical Co., Ltd.), ASTRAZON BLUE G (available from FABENFABRIKEN BAYER), DIACRYL SUPRA BRILLIANT 2B (Mitsubishi Kagaku), AIZEN CATHILON TURQUOISE BLUE LH (available from Hodogaya Chemical Co., Ltd.), AIZEN DIAMOND GREEN GH (available from Hodogaya Chemical Co., Ltd.), and AIZEN MALACHITE GREEN (available from Hodogaya Chemical Co., Ltd.). Particularly preferred among these dyes are crystal violet, ethyl violet, and victoria pure blue. The concentration of the dye in the dye solution is preferably in the range of 0.01 to 10% by weight, more preferably 0.05 to 5% by weight, particularly preferably 0.05 to 2% by weight.

In the present invention, the dye solution may comprise a surface active agent other than the anionic surface active agent represented by the general formula (I) and an organic solvent having a solubility of not less than 10% by weight in water at a temperature of 20° C. incorporated therein to improve the stability thereof.

As such a surface active agent there may be used a commonly used known surface active agent. Anionic surface active agents and nonionic surface active agents are preferred. Examples of anionic surface active agents include sulfuric esters of high alcohols ($C_8$–$C_{22}$) (e.g., sodium salt of laurylalcohol sulfate, sodium salt of octylalcohol sulfate, ammonium salt of laurylalcohol sulfate), phosphoric esters of aliphatic alcohols (e.g., sodium salt of phosphoric ester of cetylalcohol), $C_{8-22}$ alkylsulfonates (e.g., sodium salt of octylsulfonic acid, sodium salt of dodecylsulfonic acid), $C_{12-30}$ alkylaurylsulfonates (e.g., sodium salt of dodecylbenzenesulfonic acid, sodium salt of dinaphthalenedisulfonic acid), $C_{8-22}$ aliphatic carboxylates (e.g., sodium salt of stearate, sodium salt of oleic acid), sulfonates of alkylamide (e.g., methyloleyl ureide), and sulfonates of dibasic aliphatic ester (e.g., dioctylester sodiumsuccinate, dihexyl sodiumsulfosuccinate). The present invention is not limited to these compounds. Examples of nonionic surface active agents include polyethylene glycol, polyoxyethylene lauryl ether, polyoxyethylene nonyl ether, polyoxyethylene stearyl ether, polyoxyethylene behenyl ether, polyoxyethylene polyoxypropylene cetyl ether, polyoxyethylene polyoxypropylene behenyl ether, polyoxyethylene phenyl ether, oxyethylene oxypropylene block polymer, tribenzylphenolpolyethylene oxide adduct, and octylphenolpolyoxyethyleneoxypropylene adduct. The present invention is not limited to these compounds.

The concentration of such a surface active agent other than the anionic surface active agent of the general formula (I) in the dye solution is preferably in the range of 0.1 to 30% by weight, more preferably 0.5 to 25% by weight, particularly preferably 1 to 20% by weight.

Specific examples of the organic solvent having a solubility of not less than 10% by weight in water at a temperature of 20° C. include alcohols (e.g., methanol, ethanol, isopropanol, 2-ethylhexanol, tetrahydrofurfurylalcohol), ethers (e.g., 1,4-dioxane, tetrahydrofuran), ketones (e.g., methyl ethyl ketone, acetonyl acetone, diacetone alcohol), esters (e.g., methyl formate, methyl acetate, methyl lactate, ethyl lactate), polyvalent alcohols and derivatives thereof (e.g., ethylene glycol, ethylene glycol monomethyl ether, ethylene glycol monomethyl ether acetate, ethylene glycol diethyl ether, methoxy methoxy ethanol, diethylene glycol monoethyl ether, diethylene glycol monoethyl ether acetate, diethylene glycol monobutyl ether, diethylene glycol methyl ethyl ether, triethylene glycol, triethylene glycol monomethyl ether, propylene glycol, propylene glycol monomethyl ether, butanediol, trimethylol propane, 1,2,6-hexanetriol), nitrogen compounds (e.g., methylamine, dimethylamine, trimethylamine, triethylamine, isopropylamine, cyclohexylamine, triethanolamine, acetamide, acetonitrile, quinoline, morpholine), and acids (e.g., formic acid, acetic acid, butyric acid, caproic acid, cyclopropanecarboxylic acid, benzoic acid, 2-aminopropanic acid, succinic acid, phthalic acid, maleic acid, fumaric acid, tartaric acid, malic acid, oxalic acid, acetacetic acid, malonic acid, citric acid). The present invention is not limited to those compounds.

The concentration of such an organic solvent having a water solubility of not less than 10% by weight at 20° C. in the dye solution is preferably in the range of 0.1 to 30% by weight, more preferably 0.5 to 25% by weight, particularly preferably 1 to 20% by weight.

Further, the dye solution of the present invention may comprise an anti-foam fluid, a chelating agent, and an antiseptic incorporated therein.

The dye solution according to the present invention can be prepared by dissolving the foregoing components in water. The content of water in the dye solution is preferably in the range of 1 to 99% by weight, more preferably 40 to 95% by weight, particularly preferably 50 to 90% by weight.

In the dyeing process, the waterless lithographic printing plate is dipped in the dye solution. For the purpose of inhibiting the occurrence of dye spot, the surface of the printing plate may be rubbed with a brush or the like. In this process, the area which has been underdeveloped in the development process can be further developed.

In the process for the preparation of the waterless lithographic printing plate using the dye solution of the present invention, the surface of the printing plate is preferably washed with tap water after dyeing or development. Further, the printing plate which has been rinsed is preferably dried with hot air of 40° C. to 100° C.

The dye solution of the present invention can exhibit its properties most remarkably when used with an automatic developing, dyeing, rinsing and drying machine as shown in FIG. 1.

In the development step, the silicone rubber layer is removed from the image area which is the unexposed area to cause the photosensitive layer to be exposed. Alternatively, the silicone rubber layer and the photosensitive layer are removed from the image area to cause the primer layer to be exposed.

The printing plate is subsequently conveyed to the dye bath where the photosensitive layer or primer layer on the image area is dyed with the dye solution of the present invention to make a definite difference between the image area and the nonimage area.

The dyeing step is followed by rinsing and hot-air drying steps.

If the process for the preparation of the waterless lithographic printing plate using the dye solution of the present invention is effected in an automatic developing machine, all the processing solutions are preferably kept at predetermined temperatures by means of a temperature controlling mechanism. The temperature of all the processing solutions are normally controlled to a range of 15° C. to 60° C. by means of a heater interlocked with a temperature sensor. If the developer is tap water, the developer can be discharged from an overflow mechanism by supplying tap water through a faucet directly connected to the automatic developing machine so that the developer can be prevented from being decomposed or sludge from the development of silicone rubber can be discharged. For the rinsing water also, tap water can be similarly supplied to inhibit the decomposition thereof.

Examples of the process in which a faucet and an automatic developing machine are directly connected to each other to supply tap water into the automatic developing machine include a process in which tap water is supplied into the automatic developing machine by opening or closing a faucet, and a process in which tap water is supplied into the automatic developing machine upon the passage of the printing plate or at a predetermined time interval by means of a solenoid valve operative interlocked with a plate sensor or microcomputer. All the processing solutions are preferably automatically replenished by means of a feed system operative interlocked with a liquid level sensor or microcomputer. In this case, the composition of the replenishers may be the same or different from that of the processing solutions.

For example, the relationship between the concentration ($C_1$) of any component in the dye solution and the concentration ($C_2$) of the same component in the replenisher is quite arbitrary but is often represented by $10 \geq C_2/C_1 \geq 0$. Components which are not contained in the original dye solution may be contained in the replenisher. Examples of such components include anti-foam fluid, chelating agent, antiseptic, dye, solvent, and surface active agent.

The waterless lithographic printing plate is imagewise exposed to light from an ultraviolet lamp with an original film kept in contact therewith or imagewise exposed to scanning laser light.

The present invention will be further described in the following examples, but the present invention should not be construed as being limited thereto. Unless otherwise indicated, all the parts are by weight.

EXAMPLE 1

(Primer layer)

A 0.3-mm thick aluminum plate according to JIS A 1050 which had been degreased by an ordinary method was dipped in a 1 wt. % aqueous solution of KBM613 (available from Shin-Etsu Chemical Co., Ltd.) as an aminosilane coupling agent, and then dried at room temperature. The aluminum plate thus treated was then coated with a primer coating solution having the following composition in a dry weight of 4 g/m². The coated material was then heated and dried at a temperature of 140° C. for 2 minutes.

| | |
|---|---|
| Sanprene IB1700D (available from Sanyo Chemical Industries, Ltd.) | 10 parts |
| Hexafluorophosphate of polycondensate of p-diazophenylamine with paraformaldehyde | 0.1 part |
| $TiO_2$ | 0.1 part |
| DEFENSA MCF323 (available from Dainippon Ink & Chemicals, Inc.) | 0.03 part |
| Propylene glycol methyl ether acetate | 50 parts |
| Methyl lactate | 20 parts |
| Pure water | 1 part |

The coated material was then exposed to light for 20 counts by means of a vacuum exposure apparatus (FT261V UDNS ULTRA-PLUS FLIPTOP PLATE MAKER, available from NUARC COMPANY, INC.).

(Photosensitive layer)

The primer-coated aluminum plate thus obtained was then coated with a photopolymerizable photosensitive layer coating solution having the following composition in a dry weight of 4 g/m². The coated material was then dried at a temperature of 100° C. for 1 minute.

| | |
|---|---|
| Polyurethane resin (isophorone diisocyanate/polyester (adipic acid/1,6-butanediol/ethylene glycol)/2,2-dimethylpropane-1,3-diol/isophorone diamine) | 1.5 parts |
| A-600 (polyethylene glycol diacrylate, available from Shinnakamura Chemical Co., Ltd.) | 0.5 part |
| Adduct of 1 mol of xylylene diamine and 4 mol of glycidyl dimethacrylate1 | 1.0 part |
| Ethyl Michler's ketone | 0.35 part |
| 2-Chlorothioxanthone | 0.10 part |
| Naphthalenesulfonate of victoria pure blue BOH | 0.01 part |
| DEFENSA MCF323 (available from Dainippon Ink & Chemicals, Inc.) | 0.03 part |
| Methyl ethyl ketone | 10 parts |
| Propylene glycol methyl ether | 25 parts |

(Ink-repelling layer)

(Ink-repelling layer)

To the photopolymerizable photosensitive layer thus obtained was then coated with a silicone rubber layer coating solution having the following composition in a dry weight of 2 g/m². The coated material was then dried at a temperature of 140° C. for 2 minutes.

| | |
|---|---|
| α, ω-Divinylpolysiloxane (polymerization degree: approx. 700) | 9 parts |
| $(CH_3)_3SiO(SiH(CH_3)O)_8Si(CH_3)_3$ | 0.4 part |
| Polydimethylsiloxane (polymerization degree: 8,000) | 0.3 part |
| Olefin chloroplatinate | 0.2 part |
| $HC\equiv CC(CH_3)_2OSi(CH_3)_3$ | 0.1 part |
| Isoper G (available from Esso Chemical Co., Ltd.) | 140 parts |

The coated material was then laminated with a 6-μm thick polyethylene terephthalate film which had been matted on one side thereof in such an arrangement that the unmatted side of the polyethylene terephthalate film was brought into contact with the silicone rubber layer to obtain a waterless lithographic printing plate.

The printing plate precursor thus obtained was laminated with and vacuum-adhered to a positive film, and then imagewise exposed to light by means of an ordinary exposure apparatus. The laminate film was then peeled off the printing plate precursor.

The waterless lithographic printing plate thus exposed was then processed by an automatic developing, dyeing, rinsing and drying machine as shown in FIG. 1.

20 l of tap water was charged into the development tank. The tap water was heated to a temperature of 45° C. 20 l of the following dye solution was charged into the dyeing tank. The dye solution was heated to a temperature of 35° C. 20 l of tap water was charged into the rinsing tank. The tap water was heated to a temperature of 20° C. The hot-air drying was effected at a temperature of 60° C.

| Dye solution | |
|---|---|
| Ethyl violet (available from Hodogaya Chemical Co., Ltd.) | 0.2 part |
| Sodium 4-methaxylenesulfonate | 16.0 parts |
| Tripropylene glycol monobutyl ether | 12.0 parts |
| Hitenol 183* (available from Dai-ichi Kogyo Seiyaku Co., Ltd.; 28% solution) | 10.0 parts |
| (solid concentration: | 2.8 parts) |
| Pure water | 61.8 parts |

*Hitenol 183: $C_{18}H_{35}O(CH_2CH_2O)_{19}SO_3Na$ 1,000 sheets of the waterless lithographic printing plate of full kiku size (medium octavo) (1003 mm×800 mm) were processed while the developing water and rinsing water were each being supplied and overflowing at a rate of 2 l per minute during processing and the dye solution was being replenished to make up for the loss as necessary. No dye staining was observed on the silicone rubber layer on the nonimage area and the back side of the support. The dye solution was drained out of the dye tank. The dye tank was then rinsed. As a result, no sludge or precipitates were observed. Further, since the resulting dye density was very high, the printing plate could be easily checked. Moreover, no foaming was observed in the dye solution.

COMPARATIVE EXAMPLE 1

The same waterless lithographic printing plate precursor as obtained in Example 1 was laminated with a positive film, and then exposed to light in the same manner as in Example 1. The laminate film was then peeled off the printing plate precursor.

On the other hand, a developing water and a rinsing water were charged into the automatic developing, dyeing, rinsing and drying apparatus as shown in FIG. 1, and then heated in the same manner as in Example 1. 20 l of a dye solution having the following composition was charged into the dye tank, and then heated to a temperature of 35° C. 1,000 sheets of the foregoing exposed waterless lithographic printing plate of full kiku size (medium octavo) (1003 mm×800 mm) were then processed by means of the automatic developing, dyeing, rinsing and drying apparatus in the same manner as in Example 1. As a result, dye staining was observed on the silicone rubber layer on the nonimage area and the back side of the support. When the printing plate was touched, hands were stained. The dye solution was then drained out of the dye tank. In order to rinse the dye tank, tap water was supplied into and circulated through the dye tank. However, the resulting precipitates clogged the filter in the circulation path.

| Dye solution | |
|---|---|
| Ethyl violet (available from Hodogaya Chemical Co., Ltd.) | 0.3 part |
| Sodium 4-methaxylenesulfonate | 14.5 parts |
| Tripropylene glycol monobutyl ether | 12.0 parts |
| Pure water | 73.2 parts |

COMPARATIVE EXAMPLE 2

The same waterless lithographic printing plate precursor as obtained in Example 1 was laminated with a positive film, and then exposed to light in the same manner as in Example 1. The laminate film was then peeled off the printing plate precursor.

On the other hand, a developing water and a rinsing water were charged into the automatic developing, dyeing, rinsing and drying apparatus as shown in FIG. 1, and then heated in the same manner as in Example 1. 20 l of a dye solution having the following composition was charged into the dye tank, and then heated to a temperature of 35° C.

When 30 sheets of the foregoing exposed waterless lithographic printing plate of full kiku size (medium octavo) (1003 mm×800 mm) were then continuously processed by means of the automatic developing, dyeing, rinsing and drying apparatus, foams overflowed the dye bath.

| Dye solution | |
|---|---|
| Ethyl violet (available from Hodogaya Chemical Co., Ltd.) | 0.2 part |
| Sodium 4-methaxylenesulfonate | 13.0 parts |
| Tripropylene glycol monobutyl ether | 9.0 parts |
| Pionin D-310 (polyoxyethylene octyl phenyl ether, HLB 13.6, available from Takemoto Yushi K.K.) | 2.0 parts |
| Pure water | 75.8 parts |

EXAMPLES 2 TO 4

The same waterless lithographic printing plate precursor as obtained in Example 1 was laminated with a positive film, and then exposed to light in the same manner as in Example 1. The laminate film was then peeled off the printing plate precursor.

On the other hand, a developing water and a rinsing water were charged into the automatic developing, dyeing, rinsing and drying apparatus as shown in FIG. 1, and then heated in the same manner as in Example 1.

20 l of a dye solution having the composition set forth in Table 1 was charged into the dye tank, and then heated as shown in Table 1. 500 sheets of the foregoing exposed waterless lithographic printing plate of full kiku size (medium octavo) (1003 mm×800 mm) were then processed by means of the automatic developing, dyeing, rinsing and drying apparatus in the same manner as in Example 1. As a result, none of these dye solutions caused stain on the silicone rubber layer on the nonimage area and the back side of the support. When the dye tank was rinsed in the same manner as in Example 1, no sludge or precipitates were observed.

TABLE 1

|  | Example 2 | Example 3 | Example 4 |
|---|---|---|---|
|  | (parts by weight) | | |
| Ethyl violet (available from Hodogaya Chemical Co., Ltd.) | 0.2 | 0.2 | 0.2 |
| Sodium 4-methaxylenesulfonate | 15.0 | 15.0 | 15.0 |
| Tripropylene glycol monobutyl ether | 12.0 | 12.0 | 12.0 |
| Latemul WX (*1) (available from Kao Corp.: 26% aqueous solution) | 15.0 (3.9*) | — | — |
| Levenol WX (*2) (available from Kao Corp.: 26% aqueous solution) | — | 10.0 (2.6*) | — |
| Hitenol 073 (*3) (available from Dai-ichi Kogyo Seiyaku Co., Ltd.: 26% aqueous solution) | — | — | 10.0 (1.96*) |
| Pure water | 57.8 | 62.8 | 65.8 |
| Stain on nonimage area | None | None | None |
| Stain on back side of support | None | None | None |
| Precipitation after rinsing of dye tank | None | None | None |
| Dyeing temperature | 38° C. | 40° C. | 35° C. |

*The figure in parentheses indicate solid content.
(*1) Latemul WX: $C_{18}H_{35}O(CH_2CH_2O)_nSO_3Na$ (n = 25–30)
(*2) Levenol WX: Mixture of $C_{16}H_{33}O(CH_2CH_2O)_nSO_3Na$ (sodium poly(oxyethylene) cetyl ether sulfate) and $C_{18}H_{35}O(CH_2CH_2O)_nSO_3Na$ (sodium poly(oxyethylene) oleyl ether sulfate) (n = 25–30)
(*3) Hitenol 073: $C_{18}H_{35}O(CH_2CH_2O)_6SO_3Na$ As mentioned above, the dye solution of the present invention allows efficient plasticization of the nonimage area, enhancing the scratch resistance of the lithographic printing plate during processing and the press life during printing. Further, the dye solution of the present invention exhibits a high dye density and a less foamability.

Moreover, the dye solution of the present invention causes no precipitation during rinsing after dyeing, preventing the silicone rubber layer on the nonimage area and the back side of the support and the rubber roller, tank and filter in the automatic developing machine from being stained.

While the invention has been described in detail and with reference to specific embodiments thereof, it will be apparent to one skilled in the art that various changes and modifications can be made therein without departing from the spirit and scope thereof.

What is claimed is:

1. A dye solution for a photosensitive lithographic printing plate requiring no fountain solution comprising a photosensitive layer and a silicone rubber layer provided in this order on a support, which comprises (a) at least one basic dye; (b) at least one organic solvent having a water solubility of less than 10% at 20° C.; (c) at least one hydrotrope agent; and (d) at least one anionic surface active agent represented by the following general formula (I):

$$R^1O-(CH_2CH_2O)_n-SO_3M^1 \qquad (I)$$

wherein $R^1$ represents an alkyl, aryl, aralkyl, alkenyl or alkynyl group;

$M^1$ represents an alkaline metal, $NH_4$, $NH(C_2H_4OH)_3$, $NH_2(C_2H_4OH)_2$ or $NH_3(C_2H_4OH)$; and n represents an integer 1 to 100.

2. The dye solution as claimed in claim 1, wherein said anionic surface active agent is selected from the group consisting of sodium poly(oxyethylene) alkyl ether sulfate, triethanolamine poly(oxyethylene) lauryl ether sulfate, ammonium poly(oxyethylene) lauryl ether sulfate, sodium poly(oxyethylene) alkyl phenol ether sulfate, and sodium poly(oxyethylene) naphthyl ether sulfate.

3. The dye solution as claimed in claim 1, wherein the content of said anionic surface active agent is from 0.01 to 30% by weight.

4. The dye solution as claimed in claim 1, wherein the content of said anionic surface active agent is from 0.1 to 20% by weight.

5. The dye solution as claimed in claim 1, wherein the content of said anionic surface active agent is from 0.5 to 15% by weight.

6. The dye solution as claimed in claim 1, wherein said organic solvent having a water solubility of less than 10% at 20° C. is selected from the group consisting of diisobutyl ketone, acetophenone, isophorone, diethyl succinate, methyl benzoate, diethyl oxalate, dimethyl phthalate, isobutyl acetate, benzyl benzoate, ethylene glycol monophenyl ether, ethylene glycol dibutyl ether, ethylene glycol benzyl ether, diethylene glycol monohexyl ether, diethylene glycol dibutyl ether, dimethyl benzyl carbitol, diethylene glycol diacetate, 2-ethylhexyl alcohol, benzyl alcohol, cyclohexanol, 1,3-octanediol, cyclohexanone, N-benzylethanolamine, anisyl alcohol, 2-N-ethylanilinoethanol, N-phenylethanolamine, triacetin, tributin, propylene glycol monophenyl ether, and compound represented by the following formula (II):

$$R^6O-(C_3H_6O)_n-R^7 \qquad (II)$$

wherein $R^6$ represents an alkyl group, an aryl group, an aralkyl group or an alkenyl group;

$R^7$ represents a hydrogen atom, an alkyl group, an aryl group, an aralkyl group or an alkenyl group; and n represents an integer of 2 or more.

7. The dye solution as claimed in claim 1, wherein the content of said organic solvent is in the range of 0.1 to 80% by weight.

8. The dye solution as claimed in claim 1, wherein the content of said organic solvent is in the range of 2 to 60% by weight.

9. The dye solution as claimed in claim 1, wherein the content of said organic solvent is in the range of 5 to 40% by weight.

10. The dye solution as claimed in claim 1, wherein said hydrotrope agent is selected from the compounds represented by the general formulae (III) to (IX):

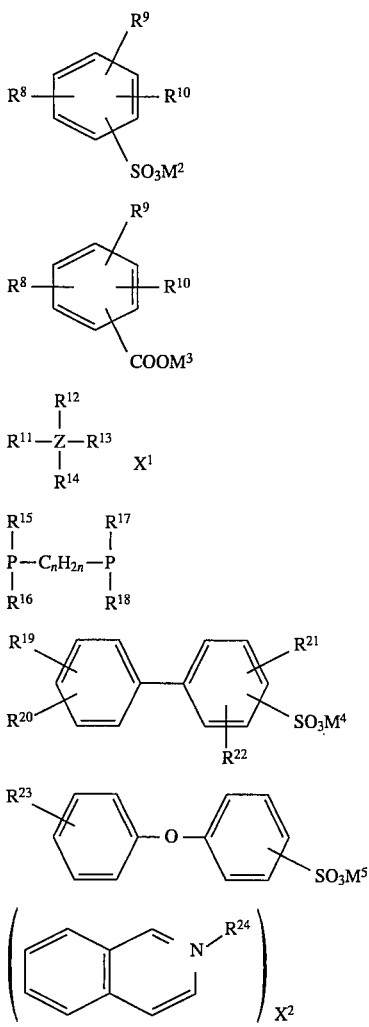

wherein, $R^8$ to $R^{10}$ each independently represent a hydrogen atom, a $C_{1-4}$ alkyl group, a $C_{1-4}$ hydroxylalkyl group, a hydroxyl group, a halogen atom, a mercapto group, —$SO_3M^6$ or —$COOM_7$;

$R^{11}$ to $R^{18}$ each independently represent a $C_{1-12}$ alkyl group, a $C_{1-4}$ hydroxyalkyl group, a benzyl group or a substituted or unsubstituted phenyl group;

$R^{19}$ to $R^{23}$ each independently represent a hydrogen atom, a $C_{1-6}$ alkyl group, a hydroxyl group, —$SO_3M^8$ or a $C_{1-6}$ hydroxylalkyl group;

$R^{24}$ represents a hydrogen atom, a $C_{1-12}$ alkyl group or a $C_{1-12}$ hydroxyalkyl group;

$M^2$ to $M^8$ each represent a hydrogen atom, an alkaline metal or $NH_4$;

Z represents N, P or B;

$X^1$ represents a counter ion;

when Z is N or P, $X^1$ represents an anion, and when Z is B, $X^1$ represents a cation;

$X^2$ represents an anion; and the suffix n represents an integer of from 1 to 5.

11. The dye solution as claimed in claim 10, wherein said hydrotrope agent is selected from the group consisting of sodium p-toluenesulfonate, sodium methaxylenesulfonate, sodium p-ethylbenzenesulfonate, sodium cumensulfonate, sodium naphthalenesulfonate, ammonium xylenesulfonate, and tetrabutylammonium bromide.

12. The dye solution as claimed in claim 1, wherein the content of said hydrotrope agent is in the range of 0.05 to 50% by weight.

13. The dye solution as claimed in claim 1, wherein the content of said hydrotrope agent is in the range of 0.5 to 30% by weight.

14. The dye solution as claimed in claim 1, wherein the content of said hydrotrope agent is in the range of 1 to 25% by weight.

15. The dye solution as claimed in claim 1, wherein said basic dye is a triarylmethane basic dye.

16. The dye solution as claimed in claim 15, wherein said basic dye is selected from the group consisting of crystal violet, ethyl violet, and victoria pure blue.

17. The dye solution as claimed in claim 1, wherein the content of said basic dye is in the range of 0.01 to 10% by weight.

18. The dye solution as claimed in claim 1, wherein the content of said basic dye is in the range of 0.05 to 5% by weight.

19. The dye solution as claimed in claim 1, wherein the content of said basic dye is in the range of 0.05 to 2% by weight.

* * * * *